US007148762B2

(12) United States Patent
Walter et al.

(10) Patent No.: US 7,148,762 B2
(45) Date of Patent: Dec. 12, 2006

(54) METHOD FOR ADJUSTING A RESONATOR IN AN OSCILLATOR

(75) Inventors: Thomas Walter, Renningen (DE); Tore Toennesen, Reutlingen (DE); Gilbert Moersch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 74 days.

(21) Appl. No.: 10/475,059

(22) PCT Filed: Apr. 17, 2002

(86) PCT No.: PCT/DE02/01420

§ 371 (c)(1),
(2), (4) Date: Apr. 19, 2004

(87) PCT Pub. No.: WO02/084787

PCT Pub. Date: Oct. 24, 2002

(65) Prior Publication Data

US 2004/0160283 A1 Aug. 19, 2004

(30) Foreign Application Priority Data

Apr. 18, 2001 (DE) ................................ 101 19 033

(51) Int. Cl.
*H03B 5/18* (2006.01)

(52) U.S. Cl. ............... 331/96; 331/117 D; 331/107 DP

(58) Field of Classification Search .................. 331/96, 331/107 DP, 117 D, 107 R
See application file for complete search history.

(56) References Cited

U.S. PATENT DOCUMENTS 4,562,370 A 12/1985 Von Dach .................. 310/312
4,639,690 A * 1/1987 Lewis ......................... 331/96
4,731,611 A 3/1988 Muller et al. ................. 342/28
5,710,530 A 1/1998 Kurisu et al. ............ 333/219.1
6,181,225 B1 1/2001 Bettner ....................... 333/235

FOREIGN PATENT DOCUMENTS

| | | |
|---|---|---|
| DE | 195 26 583 | 2/1996 |
| DE | 196 40 127 A1 | 4/1998 |
| DE | 199 38 056 | 3/2000 |
| JP | 60 123106 | 1/1985 |
| JP | 5-226915 | 9/1993 |
| JP | 05 251912 | 9/1993 |
| JP | 5-315820 | 11/1993 |
| JP | 11 017417 | 1/1999 |
| WO | WO 2000/67945 | 11/2000 |

OTHER PUBLICATIONS

Patent Abstracts of Japan, vol. 1999, No. 04, Apr. 30, 1999, JP 11 017417, Jan. 22, 1999.
Patent Abstracts of Japan, vol. 018, No. 010, Jan. 10, 1994, JP 05 251912, Sep. 28, 1993.
Patent Abstracts of Japan, vol. 009, No. 280, Nov. 8, 1985, JP 60 123106, Jul. 1, 1985.

* cited by examiner

*Primary Examiner*—Arnold Kinkead
(74) *Attorney, Agent, or Firm*—Kenyon & Kenyon LLP

(57) ABSTRACT

A method for tuning a resonator in an oscillator is provided. A dielectric serving as a resonator in the oscillator is trimmed in a targeted manner by laser pulses until a target frequency for the resonator is reached. The lasers used may be excimer lasers or solid-state lasers.

5 Claims, 2 Drawing Sheets

METHOD FOR ADJUSTING A RESONATOR IN AN OSCILLATOR

FIELD OF THE INVENTION

The present invention relates to a method for tuning a resonator in an oscillator using a laser.

BACKGROUND INFORMATION

U.S. Pat. No. 6,181,225 discloses the use of a laser to trim a resonator (slab resonator), which is manufactured from metal using a thick-film method, to tune the frequency of the resonator.

SUMMARY

The method according to the present invention for tuning a resonator in an oscillator has the advantage over the related art that the use of a dielectric makes a higher quality of the oscillator possible, which is of particular value in the very high frequency range. It is thus possible to use the oscillator, of which the resonator according to the present invention is a part, for higher frequencies in the GHz range. The direct trimming of the dielectric, formed as a resonator pellet, results in improved reproducibility of the resonator frequency to be set. The method according to the present invention is suited for the mass production of oscillators, and it thus makes a fast, safe, and simple method for frequency tuning of the resonators in oscillators possible.

It is advantageous that the laser used for trimming is operated as a pulsed laser in order to thus minimize the thermal load on the oscillator circuit.

It is also an advantage that the oscillator frequency determined by the dielectric is measured after a predetermined number of pulses in order to thus adjust the predetermined oscillator frequency in an iterative process. In one example embodiment, it is possible to set the resonator frequency automatically using a control loop.

It is also an advantage that the oscillator according to the present invention has a metallic cover, which is necessary to stimulate oscillation of the oscillator since this metallic cover results in positive feedback. The cover also has a bore through which the laser is able to aim at the dielectric in order to trim this dielectric. This makes direct trimming in the resonator possible, i.e., in the finished circuit of the oscillator, making it possible to immediately measure the success of the trimming based on the oscillator frequency.

It is a further advantage that an excimer laser or a solid-state laser, which may be laser diode-pumped, is used as a laser, such lasers having the necessary performance density for the method according to the present invention and desirable trimming properties.

It is also an advantage that an oscillator is present, which is tuned using the method according to the present invention, the oscillator having a metallic cover, a high-frequency transistor, for example an HFET or a HBT, the electrical and electronic components being connected via microstrip lines and the dielectric being designed as a cylindrical resonator pellet.

The laser used for the method according to the present invention is capable of pulsed operation to minimize the thermal load on the oscillator as described above.

DETAILED DESCRIPTION

For radar applications, e.g., in automotive engineering, it is necessary to provide an oscillator that generates signals in the very high frequency range, i.e., in the GHz range. Since methods such as Doppler frequency shift detection are used to detect objects, a precise determination and setting of the resonator frequency of the oscillator are necessary.

An oscillator has a passive and an active part. The active part, an amplifier, is a high-frequency transistor in this case, such as a high electron mobility transistor (HEMT) or a hetero bipolar transistor (HBT), for example. These transistors are usually manufactured from compound semiconductors. The passive part is the resonator. It is formed in this case by a dielectric, whose equivalent electrical circuit diagram may be formed from resistors, capacitors, and inductors, if necessary.

In manufacturing the oscillator, it is possible to set the oscillator frequency, i.e., the frequency of the signal generated by the oscillator, by precisely setting the resonator. Since a dielectric is used as a resonator in this case, this dielectric must be changed by a geometric adaptation for setting the resonator frequency. According to the present invention, this is achieved directly on the oscillator circuit by a laser used to trim the dielectric, where the laser may be operated as a pulsed laser. Since the oscillator circuit is sealed by a metallic cover, this metallic cover is provided with a bore through which the laser may be aimed at the dielectric for trimming.

Figure 1:
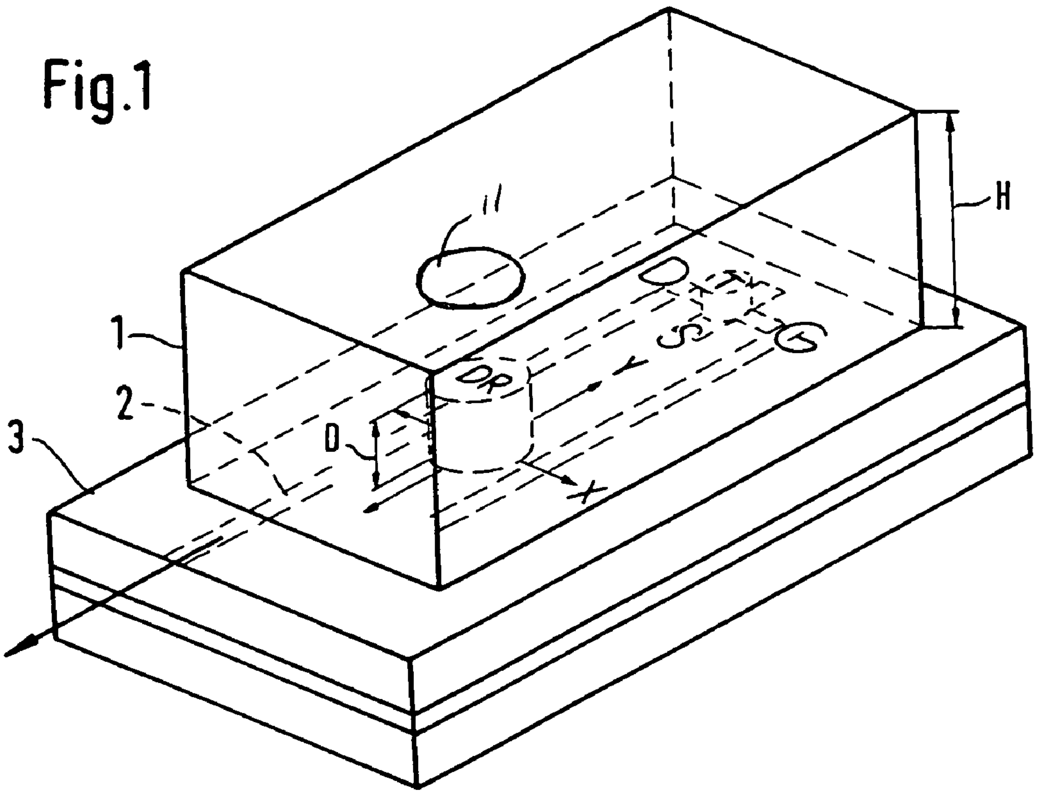
FIG. 1 shows an oscillator system having a dielectric resonator pellet.

FIG. 1 shows an oscillator system having a resonator pellet. The oscillator circuit, made up of a transistor T including its electrodes drain D, source S and gate G, a resonator pellet DR and microstrip lines, is situated on a substrate 3.

The transistor is connected to an output of the oscillator via microstrip lines 2 and also to dielectric resonator pellet DR. Resonator pellet DR has a height D, which may be changed by trimming using a laser. The height, however, determines the electrical properties of resonator pellet DR, i.e., its capacitance, inductance, and its resistance, i.e., its impedance. The impedance in turn determines the oscillator frequency. Thus a change in height D brings about a change in the oscillator or resonator frequency.

A high electron mobility transistor (HEMT), which is suited for gigahertz applications, is used in this case as transistor T. As an alternative, it is possible to use a hetero bipolar transistor (HBT). Metallic cover 1 surrounding the oscillator circuit has a height H and a bore 11 which lies directly above resonator pellet DR. The laser beam is guided through this bore to trim resonator pellet DR. A ceramic is used as the material for resonator pellet DR, in this case a combination of strontium, barium, and tantalum oxides, for example. However, other ceramics, i.e., dielectrics, are also possible. After the tuning, cover 1 may be sealed using an electrically conductive label.

Figure 2:
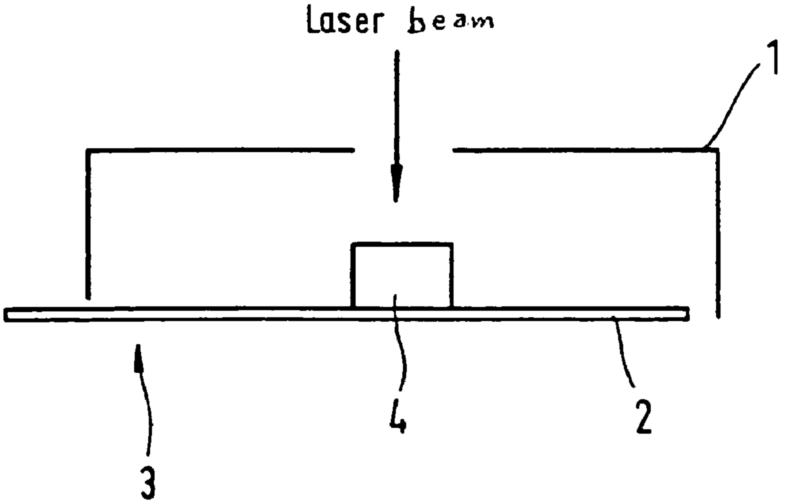
FIG. 2 shows a resonator tuning using the method according to the present invention.

FIG. 2 depicts how the resonator pellet is tuned. Resonator pellet 4 is located directly beneath the bore, through which the laser beam is guided. Resonator pellet 4 is situated on a stripline 2, which is located on a substrate 3. Cover 1 seals the oscillator circuit.

The substrate is made of a material suitable for millimeter waves, e.g., Teflon®-like materials or HF ceramics. The stripline is manufactured by structuring a metallic layer, e.g., copper. The width of such a stripline typically ranges from 0.5–1.0 mm. The thickness of the stripline is typically 40 μm. The diameter of the pellet is 2 mm, the thickness D is 1 mm.

Figure 3:
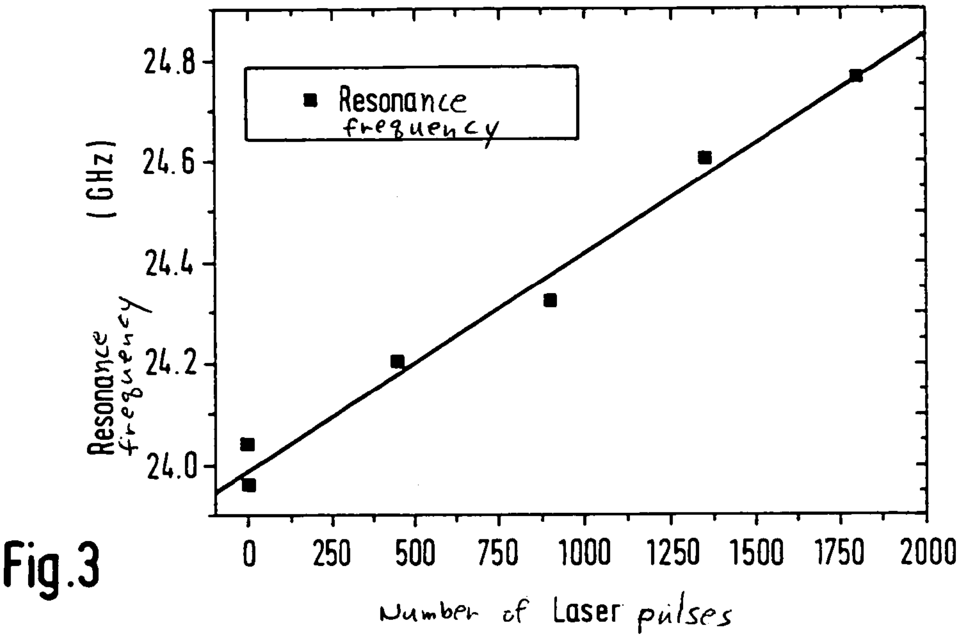
FIG. 3 shows a graph illustrating the relationship between the resonator frequency and the number of laser pulses.

FIG. 3 shows a chart illustrating the relationship between the measured resonator frequency, in gigahertz, and the number of laser pulses, obtained with the method according to the present invention. A largely linear relationship is seen between the resonator frequency and the number of laser pulses, so that the thickness and thus the oscillator frequency may be readily predicted based on the number of laser pulses.

The wavelength of the laser must be adjusted to the absorption spectrum of the ceramic (dielectric, i.e., the resonator pellet). An excimer laser, whose UV radiation is well-absorbed by the aforementioned ceramic, is suited for the ceramic referred to above. The beam profile must be adapted to the size of the pellet using masks and optics.

Figure 4:
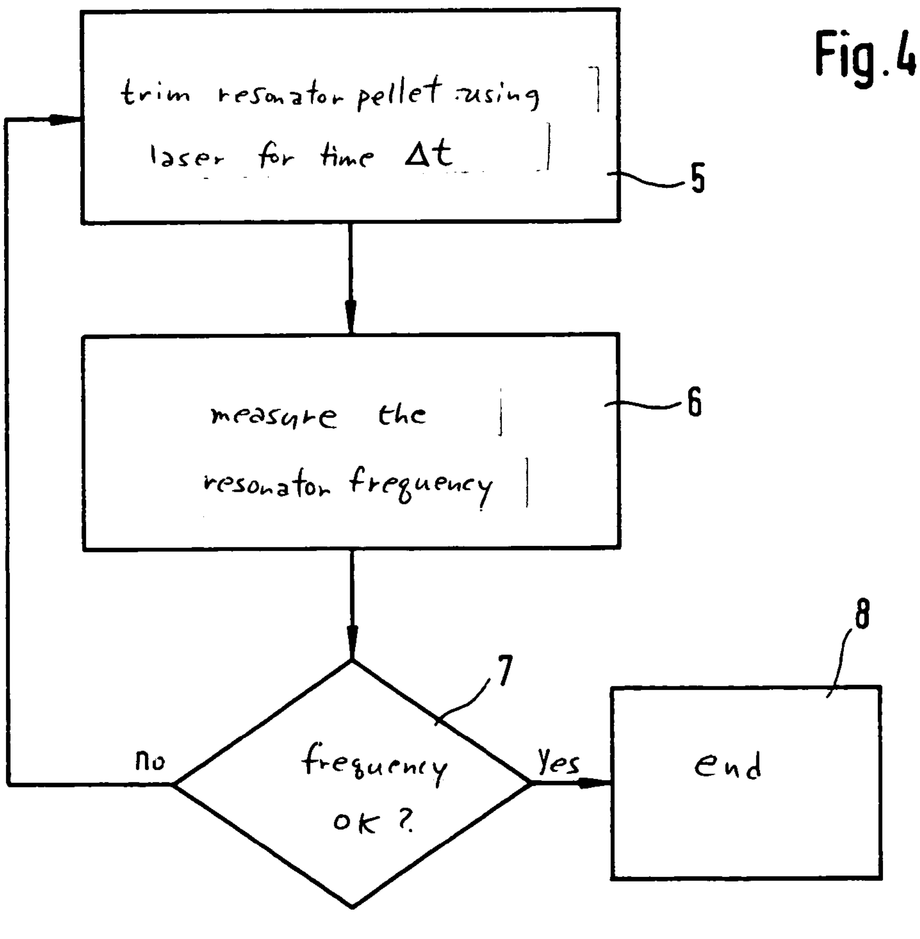
FIG. 4 shows a flow chart of the method according to the present invention.

The method according to the present invention is illustrated in a flow chart in FIG. 4. Initially, in method step 5, resonator pellet 4 is trimmed for a predetermined period of time Δt, which corresponds to a predetermined number of laser pulses, 100 for example, using a laser, e.g., an excimer laser, or a diode-pumped solid-state laser. NdYAG lasers, for example, may be used as solid-state lasers. After material has been trimmed from resonator pellet 4 for predetermined period of time Δt, the resonator frequency is measured in method step 6. If the frequency is within a predetermined range for the target frequency, the tuning is completed in method step 8. This may be attained, for example, when the obtained resonator frequency deviates from the target frequency by 1%. The frequency of the oscillator is fed to a spectrum analyzer and measured either via a suitable measuring socket and a suitable adaptor, or via the emission of a connected antenna.

If, however, it is determined in method step 7 that the target frequency has not been reached, the trimming is then continued in method step 5 using the laser. This process then proceeds iteratively until the predetermined frequency of the oscillator has been reached. This is a simple, fast, and reliable method for the production of such oscillators.

What is claimed is:

1. A method for tuning a resonator in an oscillator using a laser, comprising:

operating the laser as a pulsed laser;

trimming directly a dielectric of the resonator using the laser until a predetermined frequency of the resonator is reached; and adjusting a wavelength of the laser according to an absorption spectrum of the dielectric.

2. The method as recited in claim 1, wherein, after a predetermined number of laser pulses, the frequency of the resonator is measured and the trimming is continued.

3. The method as recited in claim 2, wherein the trimming of the dielectric using the laser is performed through a bore in a metallic cover of the resonator.

4. The method as recited in claim 3, wherein the laser is one of an excimer laser and a solid-state laser.

5. A method for tuning a resonator in an oscillator using a laser, comprising:

operating the laser as a pulsed laser;

trimming directly a dielectric of the resonator using the laser until a predetermined frequency of the resonator is reached; and adapting a beam profile of the laser to a size of the dielectric using masks and optics.

* * * * *